United States Patent [19]

Fujie

[11] Patent Number: 5,587,019
[45] Date of Patent: Dec. 24, 1996

[54] APPARATUS FOR USE IN EPITAXIAL CRYSTAL GROWTH

[75] Inventor: Koji Fujie, Tokyo, Japan

[73] Assignee: NEC Corporation, Tokyo, Japan

[21] Appl. No.: 47,552

[22] Filed: Feb. 23, 1993

[30] Foreign Application Priority Data

Feb. 26, 1992 [JP] Japan .................................. 4-075200

[51] Int. Cl.$^6$ ........................................ C23C 16/00
[52] U.S. Cl. ..................... 118/725; 118/728; 372/413; 372/415
[58] Field of Search .................... 118/725, 728; 392/413, 415

[56] References Cited

U.S. PATENT DOCUMENTS

| | | | |
|---|---|---|---|
| 3,623,712 | 11/1971 | McNeilly | 118/725 |
| 4,615,294 | 10/1986 | Scapple | 118/725 |
| 4,806,321 | 2/1989 | Nishizawa | 118/725 |
| 5,332,442 | 7/1994 | Kubodera | 118/725 |

FOREIGN PATENT DOCUMENTS

| | | | |
|---|---|---|---|
| 61-219130 | 9/1986 | Japan | 118/725 |
| 1-205428 | 8/1989 | Japan | 118/725 |
| 2-83918 | 3/1990 | Japan . | |
| 3-184325 | 8/1991 | Japan | 118/725 |

*Primary Examiner*—Richard Bueker
*Attorney, Agent, or Firm*—Laff, Whitesel, Conte & Saret, Ltd.

[57] ABSTRACT

This apparatus comprises a reactor having an inner container made of quartz, a transparent quartz window at the upper end of said reactor, a gas supply pipe for supplying a reactive gas into said reactor and an exhaust pipe for exhausting the gas remaining in the reactor. The apparatus also comprises an infrared lamp house rotatably mounted over the quartz window, and having therein a multiplicity of infrared lamps and a transparent quartz window at the lower end of the lamp house facing the quartz window of the reactor. Since the semiconductor substrate in the reactor is uniformly heated by the isolated lamp house, it is not subjected to dust that can be given off from the rotating lamp house, nor to the turbulence of the reactive gas, thereby allowing uniform growth of a semiconductor crystal on the substrate.

5 Claims, 2 Drawing Sheets

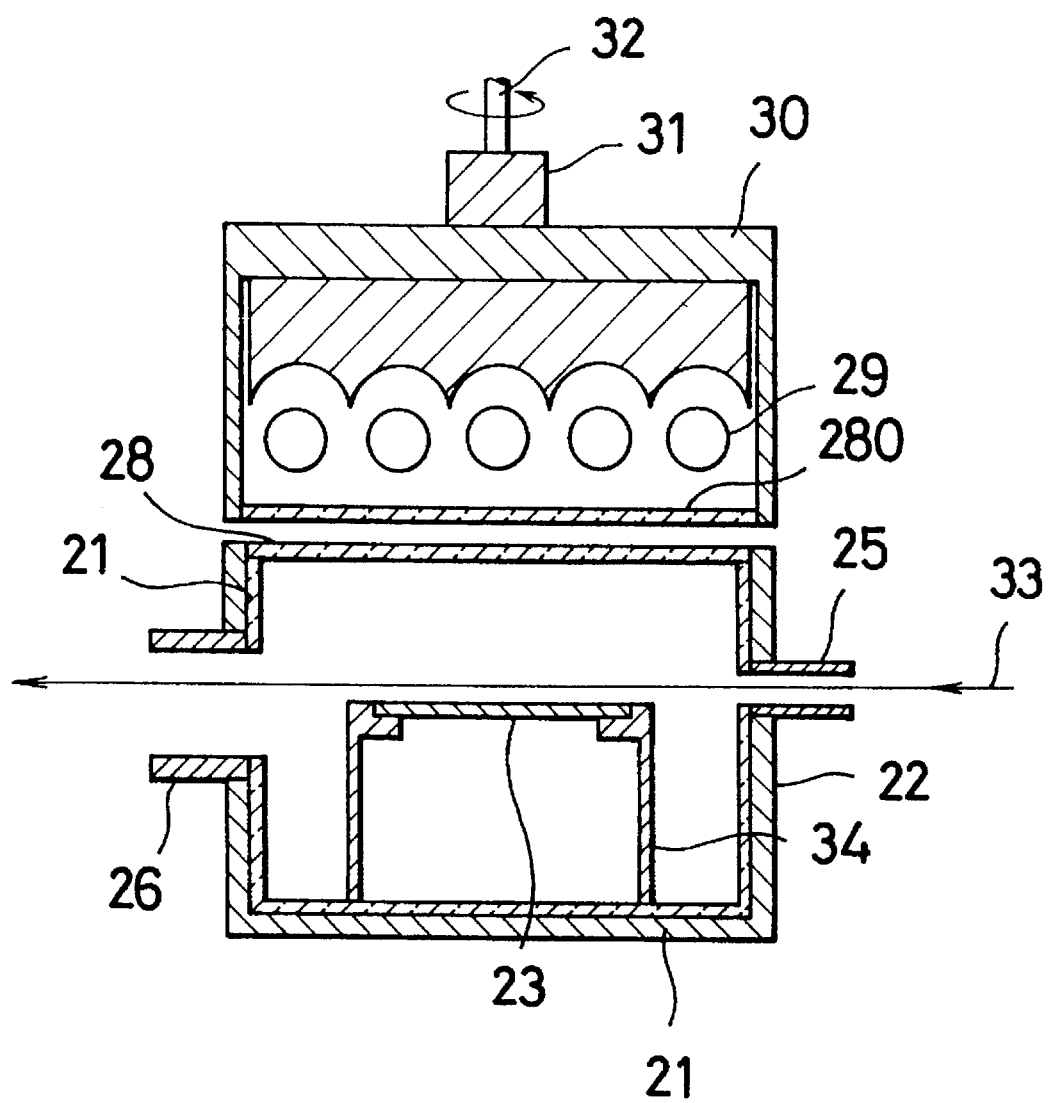

APPARATUS FOR USE IN EPITAXIAL CRYSTAL GROWTH

FIELD OF THE INVENTION

The invention relates to apparatuses suitable for epitaxially growing a thin layer of high quality semiconductor material.

BACKGROUND OF THE INVENTION

A typical conventional apparatus for epitaxially growing a semiconductor crystal is shown, in a cross sectional view, in FIG. 1. Formed inside a quartz container 1 of a reactor 2 is a suscepter 4, for holding semiconductor substrate 3. Mounted on one inner side wall of the reactor 2 are a reactive gas supply tube 5 connected with a reactive gas supply source (not shown), while mounted on the other side wall is an exhaust tube 6 connected with an exhaust system (not shown).

The suscepter 4 which has a surface of highly pure carbon coated with silicon carbide and is mounted on the upper end of a shaft 8 hermetically mounted through the container 1 via a turning mechanism 7.

Formed in the upper end of the reactor 2 is a quartz window 9, over which is a quartz window 90 of an infrared lamp house 11 accommodating therein a multiplicity of infrared lamps 10.

The semiconductor substrate 3 is mounted on top of the suscepter 4, which is then rotated by the shaft 8. With a reactive gas 12 being supplied into the reactor 2 through the reactive gas supply tube 5, the infrared lamps 10 in the infrared lamp housing 11 are activated to thereby raise the temperature inside the reactor 2. The heated reactive gas then reacts with the surface portion of the semiconductor substrate 3, forming a thin layer of semiconductor layer. After the growth, the reactive gas remaining in the reactor 2 is exhausted through the exhaust tube 6.

Although a crystal layer may be formed on the semiconductor substrate in such a conventional apparatuses as mentioned above, the apparatuses have disadvantages in that the turning mechanism 7 is exposed in the reactor 2, giving off dust from its shaft into the reactor 2, which dust can be deposited on the semiconductor substrate 3, causing a contamination of the crystal grown on the semiconductor substrate 3. Such a turning mechanism is utilized in the prior art since the suscepter 4 must be rotated in order to make the temperature distribution of the semiconductor substrate 3 uniform.

The conventional apparatuses have a further disadvantage that the reactive gas 12 will have a turbulent flow 13 over the semiconductor substrate 3 because of the rotation of the suscepter 4 by the shaft 8, so that the uniformity of the crystal layer formed on the semiconductor substrate 3 is decreased.

SUMMARY OF THE INVENTION

An object of the invention is to provide an apparatus for epitaxially growing a semiconductor crystal in an atmosphere in the reactor free of such dust particles.

Another object of the invention is to provide an apparatus for epitaxially growing a semiconductor crystal under non-turbulent flow of reactive gas.

In accordance with the invention an apparatus for epitaxially growing a semiconductor crystal is provided to attain these objects. The apparatus of the invention comprises: a reactor having an inner container made of quartz, a transparent quartz window at the upper end of the reactor, a gas supply pipe for supplying a reactive gas into the reactor and an exhaust pipe for exhausting the gas remaining in the reactor, with both of the tubes mounted through opposite side walls of the reactor, respectively; a semiconductor support member fixedly mounted in said container of the reactor for supporting a semiconductor substrate; and an infrared lamp house rotatably mounted over said quartz window.

In this apparatus the semiconductor substrate may be heated uniformly by infrared light, so that the surface of the semiconductor substrate is maintained at a uniform temperature. Since no mechanical tuning mechanism is involved in the reactor, unwanted dust may be eliminated from the reactor. Furthermore, turbulence of the reactive gas is prevented. Thus, a high quality semiconductor crystal free of contamination and having a uniform thickness may be epitaxially grown.

The infrared lamp house preferably encloses therein a multiplicity of infrared lamps and has a transparent quartz window in the lower end of the house, said window facing said upper quartz window of the reactor.

The lamp housing has preferably a hermit structure so that it does not scatter dust from inside to the surroundings. The transparent quartz windows permits an efficient penetration of infrared light therethrough to heat the semiconductor substrate.

The semiconductor support member mounted inside the reactor preferably includes a suscepter made of high purity carbon with its surface coated with silicon carbide, said suscepter mounted at the upper end of a quartz supporter.

By a use of the suscepter the uniformity of the temperature of the semiconductor substrate may be enhanced.

The suscepter is preferably provided with a recess formed on the upper surface of the suscepter for receiving therein a semiconductor substrate.

The semiconductor support member may be a quartz supporter secured on the bottom of the container and has a configuration to support only the peripheral portion of the semiconductor substrate.

The support member having this structure may further reduce contamination of the semiconductor crystal grown since it is made of purified quartz and is in contact only with the peripheral portion of the substrate.

BRIEF DESCRIPTION OF THE DRAWINGS

FIG. 3 is a cross section of a second apparatus for epitaxially growing a semiconductor crystal according to the invention.

DETAILED DESCRIPTION OF THE PREFERRED EMBODIMENT

The invention is now described by way of example.

Figure 1:
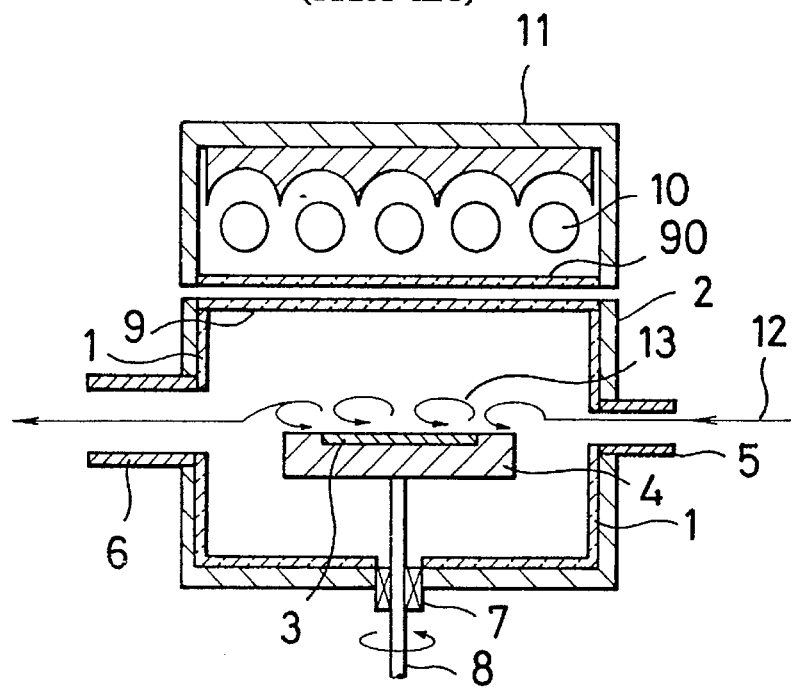
FIG. 1 is a schematic cross section of a conventional apparatus for epitaxially growing a semiconductor crystal.
Figure 2:
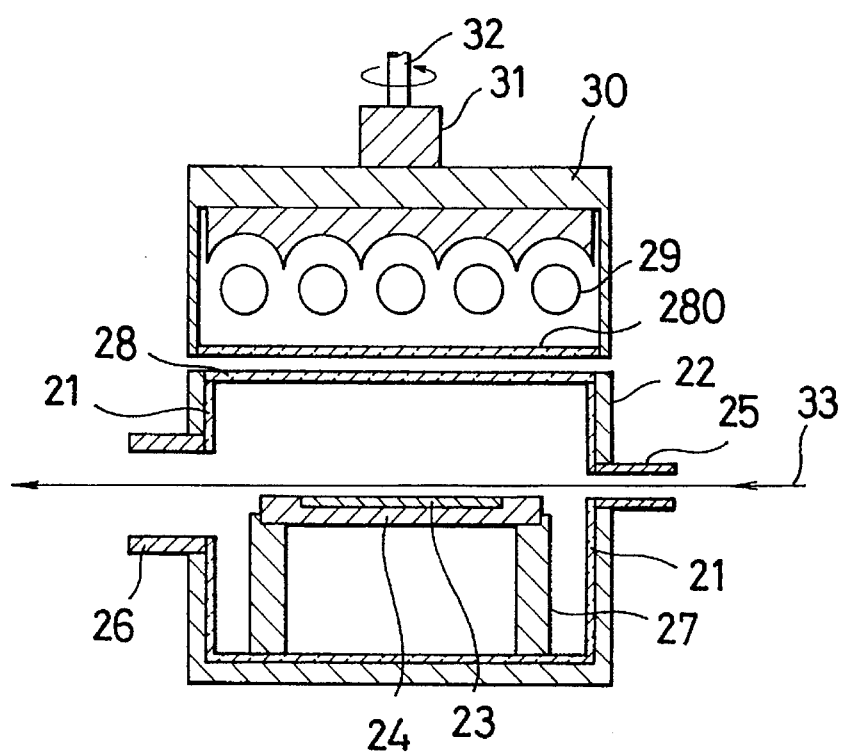
FIG. 2 is a cross section of a first apparatus for epitaxially growing a semiconductor crystal according to the invention.

Referring to FIG. 2, there is shown a first apparatus of the invention. A reactor 22 has an inner container 21 which is made of quartz. Mounted in the reactor 22 is a suscepter 24 for supporting a semiconductor substrate 23. Hermetically mounted through one side wall of the reactor 22 is a reactive gas supply pipe 25 connected with an external reactive gas source (not shown) and through the opposite side wall is an exhaust gas pipe 26 connected with an external exhaust system (not shown). The suscepter 24 mounted inside the reactor 22 holds a semiconductor substrate 23.

The surface of the suscepter 24, which is made of high purity carbon, is coated with high purity silicon carbide. The suscepter 24 is mounted on a quartz suscepter supporter 27 secured inside the container. Formed on the upper surface of the suscepter 24 is a recess for receiving therein, for example, an 8-inch semiconductor substrate. The reactor 22 has a transparent quartz window 28 formed in the upper end of the reactor 22. Mounted over and adjacent the reactor 22 is an infrared lamp housing 30, which includes a multiplicity of infrared lamps 29. A typical number of lamps is 5, say.

A turning mechanism 31, including such elements as bearings, is mounted over the infrared lamp house 30 for rotating the infrared lamp house 30 through a shaft 32 connected with the infrared lamp house 30.

In order to grow an epitaxial crystal on a semiconductor substrate 23, the substrate 23 is placed on the suscepter 24, and a reactive gas 33 is introduced into the reactor 22 through the reactive gas supply pipe 25 while the gas inside the reactor 22 is withdrawn from the exhaust gas pipe 26 by the external exhaust system (not shown). Then the infrared lamp house 30 is rotated at the speed of about 10 to 20 rpm with the lamps 29 turned on. The infrared radiation emitted from the infrared lamps 29 is passed through the transparent quartz window 28 of the infrared lamp housing 30 as well as the transparent quartz window 28 of the reactor 22 and onto the semiconductor substrate 23 uniformly, thereby heating the surface of the semiconductor substrate 23. Under this condition the reactive gas 33 introduced into the reactor 22 through the reactive gas supply pipe 25 reacts with the semiconductor substrate 23 on the surface, thereby growing an epitaxial layer of semiconductor on the surface. The residual reactive gas is exhausted from the exhaust gas pipe 26.

In this manner, by irradiating the semiconductor substrate 23 by the infrared light from the isolated turning infrared lamp housing 30 over the reactor 22, the surface of the semiconductor substrate 23 is uniformly heated without being contaminated by dust, due to the fact that as pointed out above, no mechanical source of dust is involved in the reactor 22. The epitaxial semiconductor crystal thus formed on the substrate 23 is therefore has high purity.

It should be appreciated that since the semiconductor substrate 23 need not be rotated, the turbulence of the reactive gas 33 that would occur in conventional apparatus will not takes place, thereby enhancing crystalline uniformity of the epitaxially grown semiconductor layer.

In one of the epitaxial semiconductor crystals grown in accordance with the apparatus described above, it is shown in the measurement of crystalline defects using a laser-type particle detector that spikes caused by impurities was less than 5, which is exceedingly lower than conventional levels which ranges between about 100 and 200. This proves that the contamination is greatly reduced by the invention.

Results of FT-IR(Fourier Transform Infrared Spectroscopy) measurement also show that non-uniformity of a layer thickness of an epitaxially grown crystal formed by the apparatus of the invention is reduced to about 1 to 2% as compared to about 2 to 3% for conventional epitaxial crystals. This verifies an improvement provided by the invention regarding the uniformity in layer thickness.

Referring to FIG. 3, there is shown a second example of the invention in which like or corresponding elements as those in FIG. 2 are referred to by the same reference numbers. The difference between the first and the second examples is that in the second example the semiconductor substrate 23 is placed directly on the substrate supporter 34 made of quartz. The substrate supporter 34 has a cylindrical structure to hold a semiconductor substrate by supporting only the outer periphery portion of the substrate, which portion is about 2 to 5 mm in width.

With this quartz substrate supporter 34, only the outer periphery of 2 to 5 mm of the substrate is in contact with clean quartz. This further reduces the contamination of the substrate, in contrast to the first example where the semiconductor substrate is in contact entirely with the suscepter coated with a silicon carbide, which contains much impurities of heavy metals than purified quartz.

Measurement of the contamination performed for an epitaxial crystal grown in the second apparatus shows that the impurities exist only less than $1 \times 10^9$ atoms/cm$^3$, in comparison to conventional impurity level which ranges from $1 \times 10^{10}$ to $5 \times 10^{10}$ atoms/cm$^3$.

I claim:

1. An apparatus for epitaxially growing a semiconductor crystal, comprising:

a reactor having an inner container made of quartz, a transparent quartz window at the upper end of said reactor, a gas supply pipe for supplying a reactive gas into said reactor and an exhaust pipe for exhausting the gas remaining in the reactor, with both tubes mounted through opposite side walls of the reactor, respectively, said reactor being completely sealed except for said gas supply and exhaust pipes;

a semiconductor support member fixedly mounted in said container of said reactor for supporting a semiconductor substrate; and a hermetically sealed infrared lamp housing rotatably mounted over said quartz window and in parallel with said quartz window, wherein said reactor and said lamp housing are completely separate from each other.

2. An apparatus as claimed in claim 1, wherein said infrared lamp housing has a transparent quartz window in the lower end of said housing, said window of said lamp housing facing said upper quartz window of said reactor in a spaced parallel relationship; and said infrared lamp housing encloses therein a multiplicity of infrared lamps.

3. An apparatus as claimed in claim 1, wherein said semiconductor support member includes a suscepter made of high purity carbon with its surface coated with silicon carbide, said suscepter being mounted at the upper end of a quartz supporter.

4. An apparatus as claimed in claim 3, wherein said suscepter is provided with a recess formed on the upper surface of said suscepter for receiving therein a semiconductor substrate.

5. An apparatus as claimed in claim 1, wherein said semiconductor support member is a quartz supporter secured on the bottom of said container and having a structure to support the peripheral portion of said semiconductor substrate.

\* \* \* \* \*